United States Patent [19]
Cho

[11] Patent Number: 6,028,000
[45] Date of Patent: Feb. 22, 2000

[54] METHOD OF FORMING CONTACT PLUGS IN SEMICONDUCTOR DEVICE HAVING DIFFERENT SIZED CONTACT HOLES

[75] Inventor: Gyung-Su Cho, Kyoungki-do, Rep. of Korea

[73] Assignee: Hyundai Electronics Industries Co., Ltd., Kyoungki-do, Rep. of Korea

[21] Appl. No.: 08/960,899

[22] Filed: Oct. 30, 1997

[30]    Foreign Application Priority Data

Nov. 2, 1996 [KR] Rep. of Korea ................. 96-51690

[51] Int. Cl.[7] ............................................. H01L 21/4763
[52] U.S. Cl. ...................... 438/638; 463/637; 463/627; 463/629; 463/643; 463/653; 463/672; 463/685
[58] Field of Search ................................. 438/638, 637, 438/627, 629, 643, 653, 672, 685

[56]    References Cited

U.S. PATENT DOCUMENTS

| | | | |
|---|---|---|---|
| 4,987,099 | 1/1991 | Flanner | 437/192 |
| 5,260,232 | 11/1993 | Muroyama et al. | 437/187 |
| 5,648,298 | 7/1997 | Cho | 437/187 |
| 5,670,427 | 9/1997 | Cho | 437/195 |

OTHER PUBLICATIONS

Wolf, Silicon Processing for the VLSI Era:vol. 2–Process Integration, Lattice Press, pp. 247–248, 1990.

*Primary Examiner*—John F. Niebling
*Assistant Examiner*—David A. Zarneke
*Attorney, Agent, or Firm*—Ware, Fressola, Van Der Sluys & Adolphson LLP

[57]    ABSTRACT

The present invention discloses a forming method for metal wiring in a semiconductor device with different sized contact holes. The metal wiring in a semiconductor device according to the present invention is formed by the following processes. First, a semiconductor substrate on which an insulation film having a plurality of different sized contact holes is formed is provided. A barrier metal layer is then formed on the substrate and a first tungsten film is formed on entire surface of the barrier metal layer thick enough to fill relatively smaller contact hole among the different sized contact holes. Next, the first tungsten film and the barrier metal layer are removed to expose the top surface of the insulation film. A second tungsten film is formed selectively on the contact holes thick enough to completely fill relatively larger contact hole among the different sized contact holes and the surface of the substrate is then planarized.

12 Claims, 3 Drawing Sheets

METHOD OF FORMING CONTACT PLUGS IN SEMICONDUCTOR DEVICE HAVING DIFFERENT SIZED CONTACT HOLES

BACKGROUND OF THE INVENTION

1. Field of the Invention

The present invention relates to a method of forming a metal wiring in a semiconductor device, and more particularly to a method of forming contact plugs in a semiconductor device having different sized contact holes.

2. Description of the Related Art

In semiconductor devices today, as the degree of integration becomes higher, the size of their contact holes became smaller. The integration of semiconductor devices are mainly of reduction in width which causes increase in their aspect ratio. Accordingly, when the metal wiring are formed by the conventional sputtering method, problem such as a break in metal wiring will cause decrease in semiconductor device reliability.

To overcome problems caused by the increase in aspect ratio, forming plugs with tungsten has been recently suggested. To form these tungsten plugs, a tungsten film is deposited thickly on the entire surface of the substrate so as to completely fill contact holes.

However, to form plugs in a semiconductor having different sized contact holes, tungsten films are deposited so that they are thick enough to fill all the contact holes simultaneously. Accordingly, the manufacturing cost increases because more tungsten is necessary. Also, the manufacturing period increases because more time is necessary in order to remove the surplus tungsten film. Moreover, the increased thickness of the tungsten film will increase the stress of underlying layers during the etching process. Also, after the etching process, global aspect on the surface of the tungsten will cause decrease in the reliability of the metal wiring.

SUMMARY OF THE INVENTION

The object of the present invention is to provide a method of forming metal wiring capable of enhancing the reliability of metal wiring in a semiconductor device with different sized contact holes. The above described object is achieved by reducing the amount of tungsten deposited to form plug in the contact holes and preventing formation of global aspect which occur after tungsten film etching.

To achieve the above described object, the metal wiring in a semiconductor device according to the present invention is formed by the following processes. First, a semiconductor substrate on which an insulation film having a plurality of different sized contact holes is formed is provided. A barrier metal layer is then formed on the substrate and a first tungsten film is formed on entire surface of the barrier metal layer thick enough to fill relatively smaller contact hole among the different sized contact holes. Next, the first tungsten film and the barrier metal layer are removed to expose the top surface of the insulation film. A second tungsten film is formed selectively on the contact holes thick enough to completely fill relatively larger contact hole among the different sized contact holes and the surface of the substrate is then planarized.

According to the present invention, a tungsten plug is first formed in the relatively smaller contact hole by filling in the first tungsten film in the smaller contact hole. After, a tungsten plug is also formed in the relatively larger contact hole by filling the second tungsten film selectively in the unfilled portion of the larger contact hole. Accordingly, without depositing on the entire surface of the substrate the tungsten film thick enough to fill all contact holes simultaneously, different sized contact holes can be easily filled by utilizing the first tungsten film and the second tungsten film. Moreover, stress generated on the films underneath the tungsten film in the etching process of the tungsten film is reduced since the tungsten film is thinner than the prior art. Thus global aspect generated after etching is avoided thereby enhancing surface characteristic and metal wiring reliability. Also, manufacturing period on account of tungsten film etching is reduced. As the amount of tungsten used is reduced, manufacturing cost is also reduced.

DETAILED DESCRIPTION OF THE INVENTION

Hereinafter, a preferred embodiment of the present invention will be explained in more detail with reference to the accompanying drawings.

FIG. 1A to FIG. 1F are sectional views to describe a method of forming metal wiring in a semiconductor device according to an embodiment of the present invention.

Figure 1A:
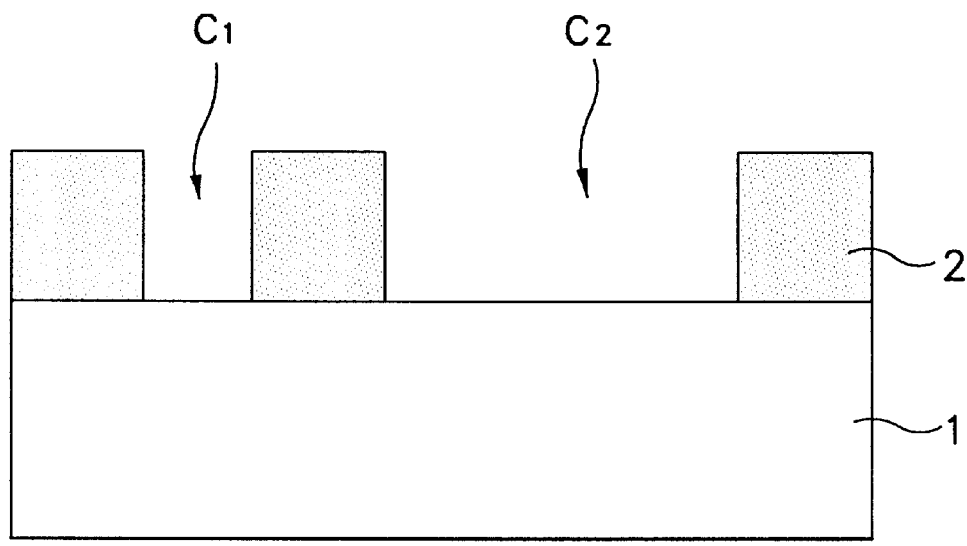
FIG. 1A to FIG. 1F are sectional views to describe a method of forming metal wiring in a semiconductor device having different sized contact holes by utilizing contact plugs in accordance with an embodiment of the present invention.
Figure 1B:
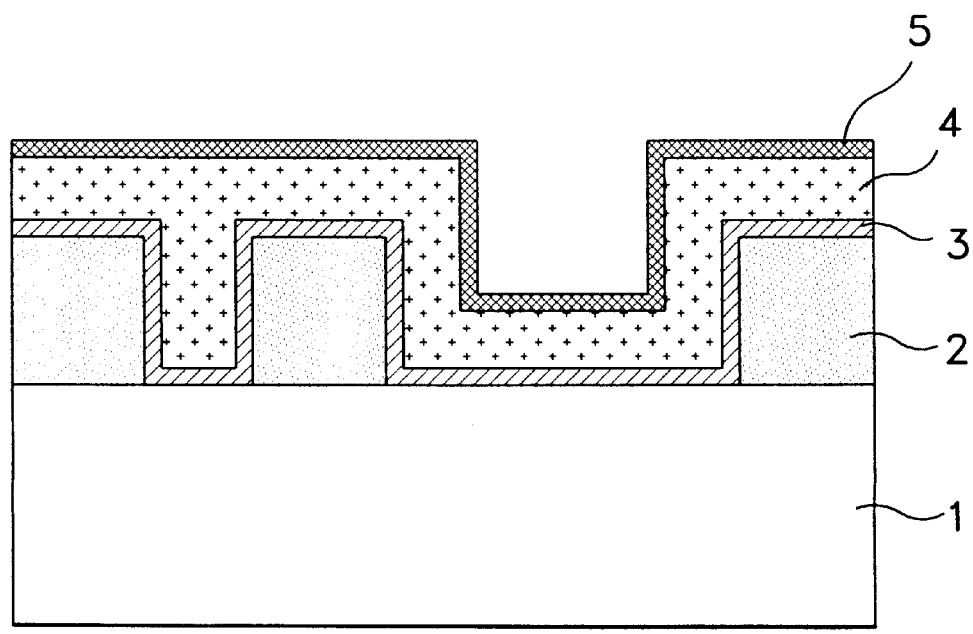

As shown in FIG. 1A, a semiconductor substrate 1 on which an oxide film layer 2 having different sized contact holes C1 and C2 is formed, is provided. Next, as shown in FIG. 1B, a barrier metal film 3, preferably less than 2000 Å thick, is formed on the resulting structure shown in FIG. 1A. The barrier metal film 3 is a stacked metal film of two metal layers each made of different refractory metal. The barrier metal film 3 is a stacked metal film of titanium layer and titanium nitride layer. Instead of the titanium, a metal selected from the group of tantalum, silicon, molybdenum, and cobalt can be employed. Also, instead of the titanium-nitride, titanium-tungsten can be employed. Next, a first tungsten film 4 thick enough to fill in the smaller contact hole C1 is deposited on the entire surface of the barrier metal layer 3. Then a polysilicon film 5 is formed over the first tungsten film 4. The polysilicon film 5 acts as a seed to selectively form a second tungsten film in the later step. Here, forming of the polysilicon film 5 can be omitted.

Figure 1C:
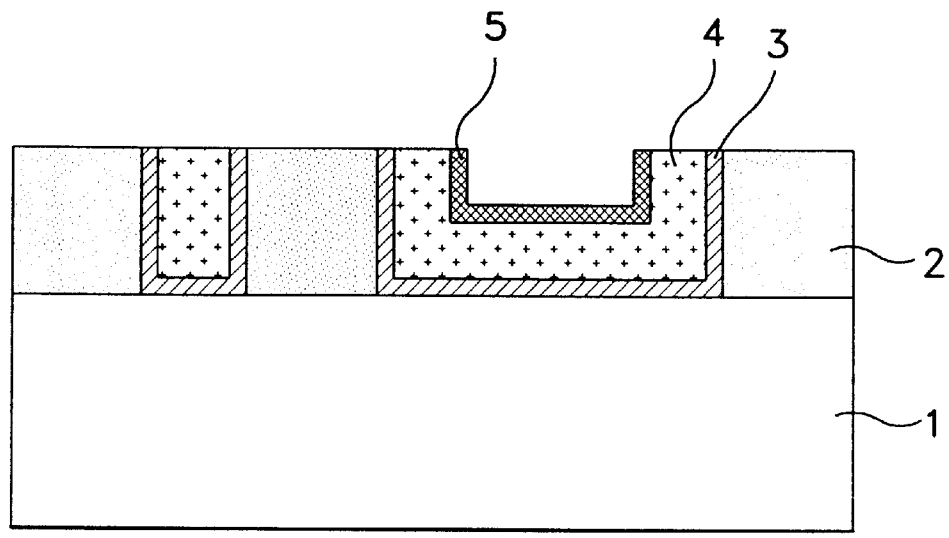

Referring to FIG. 1C, the polysilicon film 5, the first tungsten film 4, and the barrier metal layer 3 is removed to expose the top surface of the oxide film 2 using chemical mechanical polishing (CMP) method. As shown in FIG. 1C, a tungsten plug is formed in the smaller contact hole C1. Next, the resulting structure is heat-treated. The heat-treatment is performed at a temperature of 300° C. or higher for 10 minutes or more.

Figure 1D:
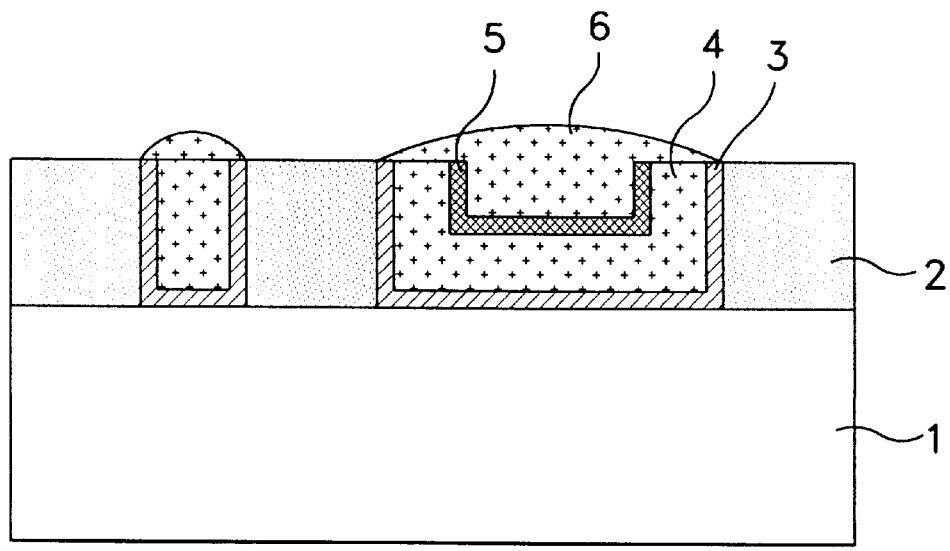
Figure 1E:
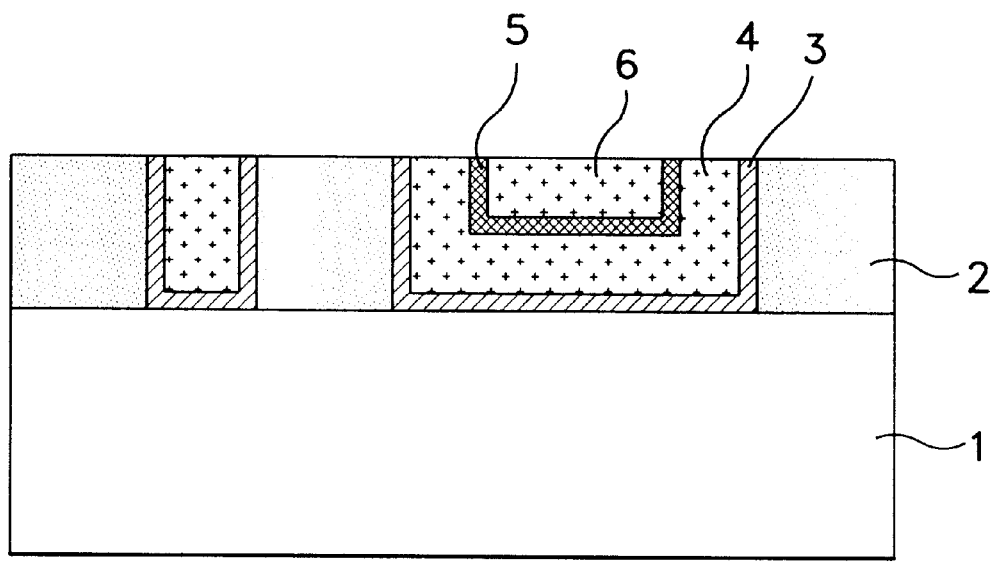

As shown in FIG. 1D, a second tungsten film 6 is formed selectively over the larger contact hole C2 to completely fill the same. Next, as shown in FIG. 1E, unnecessary part of the second tungsten film 6 is removed using CMP in order to planarize the surface of the substrate. Finally, a tungsten plug is also formed in the larger contact hole C2.

Figure 1F:
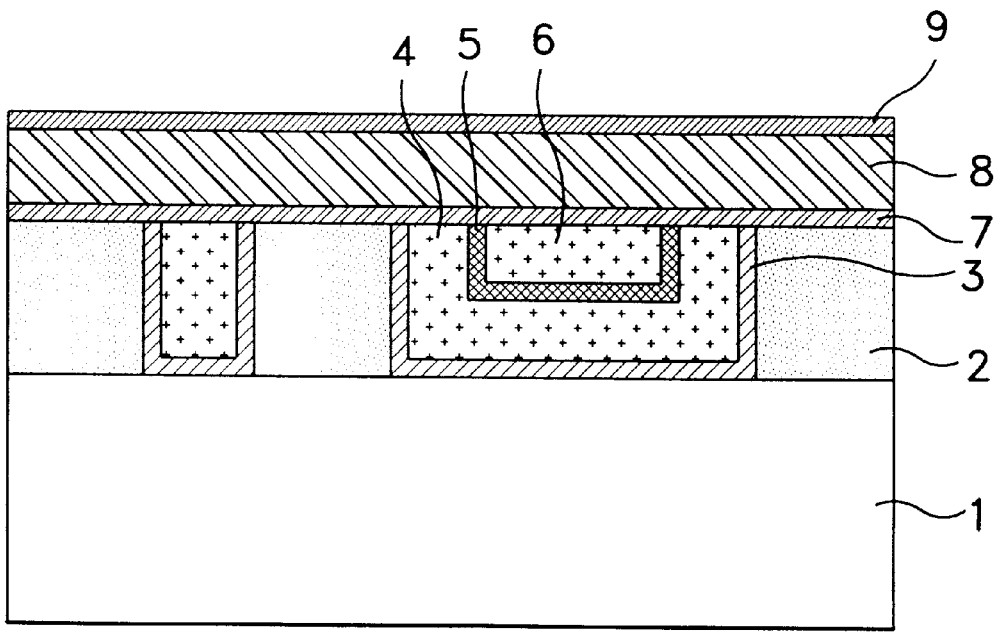

Referring to FIG. 1F, a refractory metal layer 7 is formed on the resulting structure shown in FIG. 1E. After, a metal layer 8 for forming wiring, and a anti-reflective coating film 9 are sequentially formed on the refractory metal layer 7.

The metal layer 8 for forming wiring comprises a low resistant material, i.e., aluminum alloy or copper. Moreover, although not illustrated in the drawings, the anti-reflective coating film 9, the metal wiring for forming wiring 8, and the refractory metal layer 7 are patterned to form a wiring.

According to the above described embodiment of the present invention, a tungsten plug is first formed in the relatively smaller contact hole by filling the first tungsten film in the smaller contact hole and planarizing the surface of the substrate using CMP method. After, a tungsten plug is also formed in the relatively larger contact hole by selectively filling the second tungsten film in the unfilled portion of the larger contact hole and planraizing the surface of the substrate using CMP method. Accordingly, without depositing a tungsten film thick enough to fill all contact holes simultaneously, different sized contact holes can be easily filled by utilizing the first tungsten film and the second tungsten film. Moreover, stress generated on the films underneath the tungsten film in the etching process of the tungsten film is reduced since the tungsten film is thinner than the prior art. Thus global aspect generated after etching is avoided thereby enhancing surface characteristic and metal wiring reliability. Also, manufacturing period on account of tungsten film etching is reduced. As the amount of tungsten used is reduced, manufacturing cost is also reduced.

While this invention has been described with reference illustrative embodiments, this description is not intended to be construed in a limiting sense. Various modifications of illustrative embodiments, as well as other embodiments of the invention, will be apparent to persons skilled in the art upon reference to this description. It is therefore contemplated that the appended claims will cover any such modifications of embodiments as falling within the true scope of the invention.

What is claimed is:

1. A method for forming a metal wiring utilizing plugs in a semiconductor device having different sized contact holes, comprising the steps of:

providing a semiconductor substrate on which an insulation film having a plurality of different sized contact holes is formed;

forming a barrier metal layer on the substrate;

forming a first tungsten film on entire surface of the barrier metal layer thick enough to fill relatively smaller contact hole among the different sized contact holes;

forming a polysilicon film over the first tungsten film;

removing a portion of the polysilicon film, the first tungsten film and the barrier metal layer to expose the top surface of the insulation film;

forming a second tungsten film selectively on the contact holes thick enough to completely fill relatively larger contact hole among the different sized contact holes, using the polysilicon film as a seed; and planarizing the surface of the substrate.

2. The method as claimed in claim 1, wherein the step of removing the first tungsten film and the barrier metal layer is performed by CMP method.

3. The method as claimed in claim 1, wherein the step of planarizing the surface of the substrate is performed by CMP method.

4. The method as claimed in claim 1, wherein the barrier metal layer is a stacked film of two metal layers each made of different refractory metal.

5. The method as claimed in claim 1, wherein the barrier metal layer is a stacked film of titanium layer and titanium-nitride layer.

6. The method as claimed in claim 1, wherein the barrier metal layer is a stacked film of titanium layer and titanium tungsten layer.

7. The method as claimed in claim 1, wherein the barrier metal layer is a stacked film of titanium nitride layer and other layer made of material selected from the group consisting of tantalum, silicon, molybdenum, or cobalt.

8. The method as claimed in claim 1, further comprising the steps of;

forming sequentially a refractory metal layer, a metal layer for forming wiring, and an anti-reflective coating layer on the planarized substrate;

patterning the anti-reflective coating layer, the metal layer for forming wiring and the refractory metal layer to form a wiring.

9. The method for forming a metal wiring in a semiconductor device as claimed in claim 8, wherein the metal layer for forming wiring is made of an aluminum alloy.

10. The method for forming a metal wiring in a semiconductor device as claimed in claim 8, wherein the metal layer for forming wiring is made of a copper.

11. The method for forming a metal wiring in a semiconductor device as claimed in claim 8, further comprising a step of heat-treating the substrate after the step of planarizing the substrate.

12. The method for forming a metal wiring in a semiconductor device as claimed in claim 11, wherein the heat-treatment is performed at a temperature of 300° C. or higher for 10 minutes or longer.

* * * * *